United States Patent
Lin et al.

(10) Patent No.: US 9,219,480 B2
(45) Date of Patent: Dec. 22, 2015

(54) LOW TAU SYNCHRONIZER FLIP-FLOP WITH DUAL LOOP FEEDBACK APPROACH TO IMPROVE MEAN TIME BETWEEN FAILURE

(71) Applicant: Nvidia Corporation, Santa Clara, CA (US)

(72) Inventors: Hwong-Kwo Lin, Santa Clara, CA (US); Ge Yang, Santa Clara, CA (US); Xi Zhang, Santa Clara, CA (US); Ying Huang, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 99 days.

(21) Appl. No.: 14/170,342

(22) Filed: Jan. 31, 2014

(65) Prior Publication Data
US 2015/0222266 A1    Aug. 6, 2015

(51) Int. Cl.
| | | |
|---|---|---|
| H03K 3/00 | (2006.01) | |
| H03K 19/003 | (2006.01) | |
| H03K 3/037 | (2006.01) | |
| G06F 1/10 | (2006.01) | |

(52) U.S. Cl.
CPC .............. *H03K 19/003* (2013.01); *G06F 1/10* (2013.01); *H03K 3/0372* (2013.01)

(58) Field of Classification Search
CPC ..... H03K 3/014; H03K 3/037; H03K 3/0372; H03K 3/0375; H03K 3/356; H03K 3/3562; H03K 3/35625; H03K 19/003; H03K 19/00315
USPC ......... 327/141, 185, 198, 199, 202, 203, 208, 327/210–212, 214, 215, 218, 219, 225
See application file for complete search history.

(56) References Cited

U.S. PATENT DOCUMENTS

| | | | |
|---|---|---|---|
| 6,895,061 B1 * | 5/2005 | Stong ............................. | 375/354 |
| 2011/0239069 A1 * | 9/2011 | Ramaraju et al. ............. | 714/731 |
| 2013/0069697 A1 * | 3/2013 | Nunes ........................... | 327/142 |
| 2013/0135017 A1 * | 5/2013 | Jones et al. .................... | 327/142 |

OTHER PUBLICATIONS

Davis, Leroy; "Digital Logic Metastability"; [online]; Retrieved from internet: http://www.interfacbus.com/Design_MetaStable.html; Feb. 26, 2012; 6 pgs.
Parker, Roy H.; "Caution: clock crossing. a prescription for uncontaminated data across clock domains"; Chip design magazine (2004); 7 pgs.
Mike, Stein; "Crossing the abyss: asynchronous signals in a synchronous world"; EDN 48.16 (2003); 7 pgs.

* cited by examiner

*Primary Examiner* — William Hernandez

(57) ABSTRACT

A flip-flop and a method of receiving a digital signal from an asynchronous domain. In one embodiment, the flip-flop includes: (1) a first loop coupled to a flip-flop input and having first and second stable states and (2) a second loop coupled to the first loop and having the first and second stable states, properties of cross-coupled inverters in the first and second loops creating a metastable state skewed toward the first stable state in the first loop and skewed toward the second stable state in the second loop. Certain embodiments of the flip-flop have lower time constant and thus a higher Mean Time Between Failure (MTBF).

20 Claims, 6 Drawing Sheets

LOW TAU SYNCHRONIZER FLIP-FLOP WITH DUAL LOOP FEEDBACK APPROACH TO IMPROVE MEAN TIME BETWEEN FAILURE

TECHNICAL FIELD

This application is directed, in general, to flip-flops and, more specifically, to a low time-constant (tau) synchronizer flip-flop with dual loop feedback approach to improve mean time between failure and a method of operating the same to latch digital signals transmitted between asynchronous clock domains.

BACKGROUND

Integrated circuits (ICs) having multiple clock domains have come into wide use. The multiple clock domains allow hybrid or digital circuitry sharing the same substrate to be operated at different speeds asynchronously, i.e. not necessarily related to one another.

In almost every IC design, digital signals (signals communicating defined discrete logic levels, such as zero and one) are transmitted from an asynchronous domain (e.g., a separate clock domain) without requiring the transmitting and receiving domains to be synchronized with each other before transmission occurs. In such case, a flip-flop is provided to receive the digital signal. The flip-flop is able to capture the digital signal at any time. For this reason, flip-flops employed in the context of multiple clock domains are called synchronizers.

A drawback inherent in flip-flops is experienced when the digital signal's arrival time occurs during the synchronizer's setup or hold times (defined by the clock governing the domain in which the synchronizer lies). This causes a setup or hold violation, and the synchronizer is likely to enter a "metastable state" lying at between the defined discrete logic levels at a level that depends upon the characteristics of the electronic devices constituting the flip-flop. Until internal noise causes it to resolve to a stable state (namely a defined discrete logic level), the flip-flop dwells in the metastable state, and its output is unreliable. If the flip-flop fails to exit the metastable state in the given timing window (one cycle time for a two-stage synchronizer), it is regarded as having failed. The inverse of the rate at which a flip-flop fails is Mean Time Between Failure (MTBF).

One conventional approach to improving MTBF is to decrease the rate of the clock that governs the synchronizer's domain. However, the performance loss the entire domain suffers as a result is usually intolerable. A somewhat better conventional approach is to chain multiple synchronizers together to ensure that setup or hold violations are avoided in at least one synchronizer. Unfortunately, chained synchronizers require multiple clock cycles to propagate a signal to their ultimate output, which incurs latency.

SUMMARY

One aspect provides a flip-flop. In one embodiment, the flip-flop includes: (1) a first loop coupled to a flip-flop input and having first and second stable states and (2) a second loop coupled to the first loop and having the first and second stable states, properties of cross-coupled inverters in the first and second loops creating a metastable state skewed toward the first stable state in the first loop and skewed toward the second stable state in the second loop.

In another embodiment, the flip-flop includes: (1) a flip-flop input, (2) a first transmission gate coupled to the flip-flop input and operable to be controlled by a noninverted clock signal, (3) a first master loop coupled to a flip-flop input and having first and second stable states, (4) a second master loop coupled to the first master loop and having the first and second stable states, properties of cross-coupled inverters in the first and second master loops creating a metastable state skewed toward the first stable state in the first master loop and skewed toward the second stable state in the second master loop, (5) a second transmission gate coupled to the first and second master loops and operable to be controlled by an inverted clock signal, (6) a first slave loop coupled to the second transmission gate and having first and second stable states and (7) a second slave loop coupled to the first loop and having the first and second stable states, properties of cross-coupled inverters in the first and second slave loops creating a metastable state skewed toward the first stable state in the first slave loop and skewed toward the second stable state in the second slave loop.

Another aspect provides a method of receiving a digital signal from a separate clock domain. In one embodiment, the method includes: (1) receiving the digital signal into a flip-flop having: (1a) a first loop coupled to a flip-flop input and having first and second stable states and (1b) a second loop coupled to the first loop and having the first and second stable states, properties of cross-coupled inverters in the first and second loops creating a metastable state skewed toward the first stable state in the first loop and skewed toward the second stable state in the second loop, (2) escaping from one of the first and second metastable states and (3) resolving to one of the first and second stable states.

BRIEF DESCRIPTION

Reference is now made to the following descriptions taken in conjunction with the accompanying drawings, in which.

DETAILED DESCRIPTION

It is realized herein that the conventional approaches of reducing clock rate and chaining synchronizers are impractical, because they significantly degrade performance. For example, increasing flip-flop transistor size does not necessarily improve the MTBF, as loading is also increased. It is further realized herein that a metastable state can be better tolerated if the time required to escape from it and resolve into a stable state (representing a defined discrete logic level) can be sufficiently reduced. It is still further realized that the time required to resolve into a stable state can be reduced by designing the metastable state such that it is skewed toward the stable state. It is yet further realized that a flip-flop may be intentionally designed to have a metastable state skewed toward stable states and hence faster to escape and resolve. It is still yet further realized that a flip-flop may be designed with coupled multiple loops in each of its latches, the metastable state designed such that each loop is skewed toward separate stable states.

Accordingly, introduced herein are various embodiments of a flip-flop-based synchronizer having multiple interconnected loops to provide a metastable state skewed toward different stable states in respective loops. Also introduced herein are various embodiments of a method of receiving a digital signal from an asynchronous domain. As will be described in detail hereinafter, the flip-flop and method can yield significant improvements in terms of both time constant (tau) and operating frequency (sync2d), sync2d being the maximum frequency at which a two-stage synchronizer can operate without its MTBF falling below 100 years.

Figure 1:
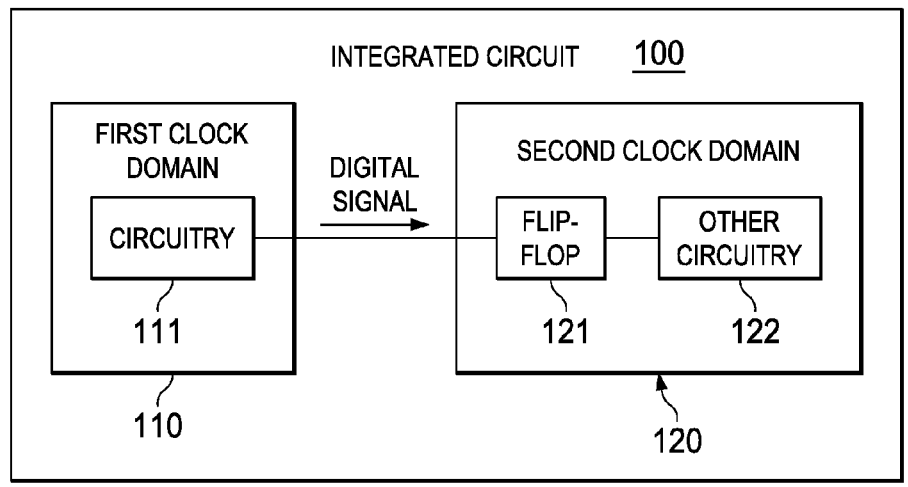
FIG. 1 is a block diagram of one embodiment of an IC having multiple clock domains.

FIG. 1 is a block diagram of one embodiment of an IC having multiple clock domains. An IC 100 has multiple clock domains, including a first clock domain 110 and a second clock domain 120. Separate (typically asynchronous) clocks (not shown) govern the first and second clock domains 110, 120. Circuitry 111 in the first clock domain 110 is operable to transmit a digital signal along an unreferenced conductor via a synchronizer flip-flop 121 to other circuitry 122. FIG. 1 is simplified. Those skilled in the pertinent art understand that ICs may have many more clock domains and more transmission of signals among the clock domains than FIG. 1 shows.

Figures 2, 4:
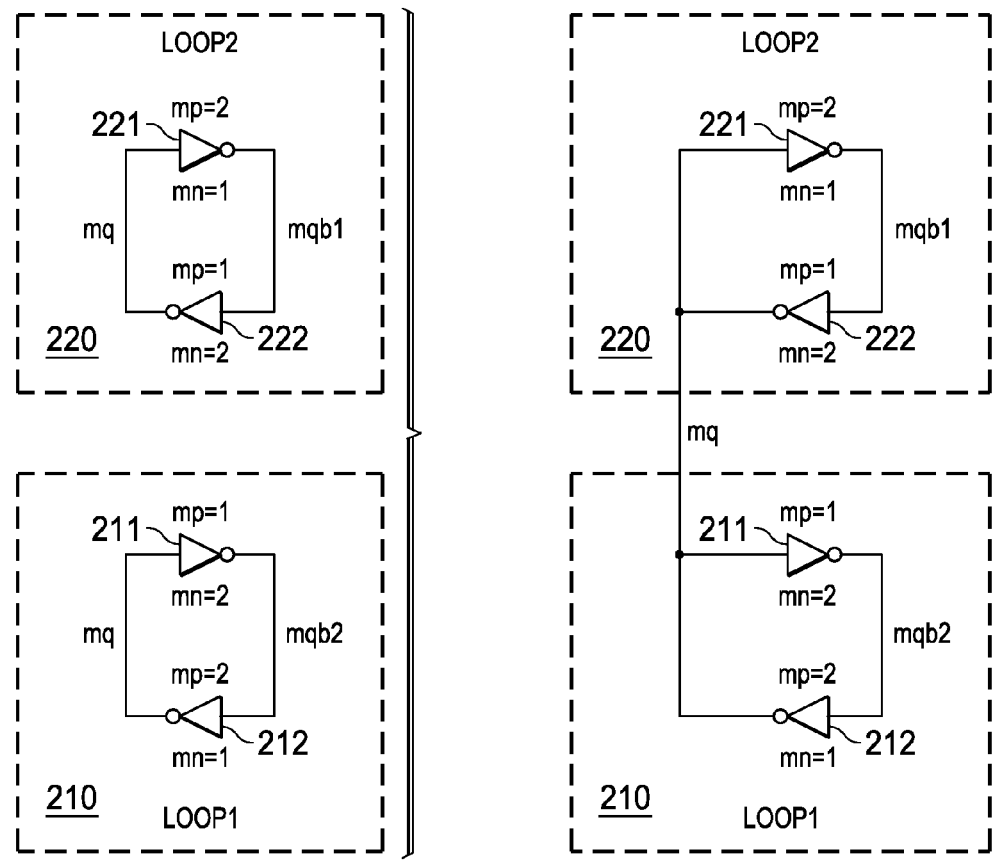
FIG. 2 is a schematic diagram of two decoupled loops of cross-coupled inverters.
FIG. 4 is a schematic diagram of two cross-coupled inverter loops with a shared mq node.

FIG. 2 is a schematic diagram of two decoupled loops of cross-coupled inverters. FIG. 2 is presented primarily for the purpose of describing metastable states in decoupled loops. A Loop1 210 includes cross-coupled inverters 211, 212. Cross-coupling the two inverters 211, 212 defines first and second stable states, namely a first stable state in which a logic zero exists at a point mq (chosen to be the input of the Loop1 210), and a logic one exists at a point mqb2 (chosen to be the output of the Loop1 210) and a second stable state in which a logic one exists at the point mq and a logic zero exists at the point mqb2. Likewise, two inverters 221, 222 of a Loop2 220 defines the first and second stable states in the Loop2 220 as between a point mq (chosen to be the input of the Loop2 220) and a point mqb1 (chosen to be the output of the Loop2 220).

The inverters 211, 212, 221, 222 contain metal-oxide semiconductor field-effect transistors (MOSFETs, or simply MOSs) (not shown). Were the physical properties identical in all of the MOSs, the metastable states would lie exactly in the center between of the first and second stable states. Indeed, conventional flip-flop designs employ p-channel and n-channel MOSs of balanced strength (i.e. mp=mn). However, in the embodiment of FIG. 2, the p-channel MOSs are weaker than the re-channel MOSs (mp<mn) in the inverter 211, and the n-channel MOSs are weaker than the p-channel MOSs (mn<mp) in the inverter 212 to skew the metastable state of the Loop1 210 toward the first stable state, namely the one at which a logic one exists at the point mqb2. In one specific embodiment, the inverter 211 has p-channel and n-channel MOSs having respective values mp=1 and mn=2, and the inverter 212 has values mp=2 and mn=1. Likewise, in the embodiment of FIG. 2, the n-channel MOSs are weaker than the p-channel MOSs (mn<mp) in the inverter 221, and the p-channel MOSs are weaker than the n-channel MOSs (mp<mn) in the inverter 222 to skew the metastable state of the Loop2 220 toward the second stable state, namely the one at which a logic zero exists at the point mqb1. In one specific embodiment, the inverter 221 has p-channel and n-channel MOSs having respective values mp=2 and mn=1, and the inverter 222 has values mp=1 and mn=2. Those skilled in the pertinent art are familiar with selecting the properties of transistors, including MOSs, to change their operating characteristics and the metastable state of a loop formed by cross-coupled inverters.

Figure 3:
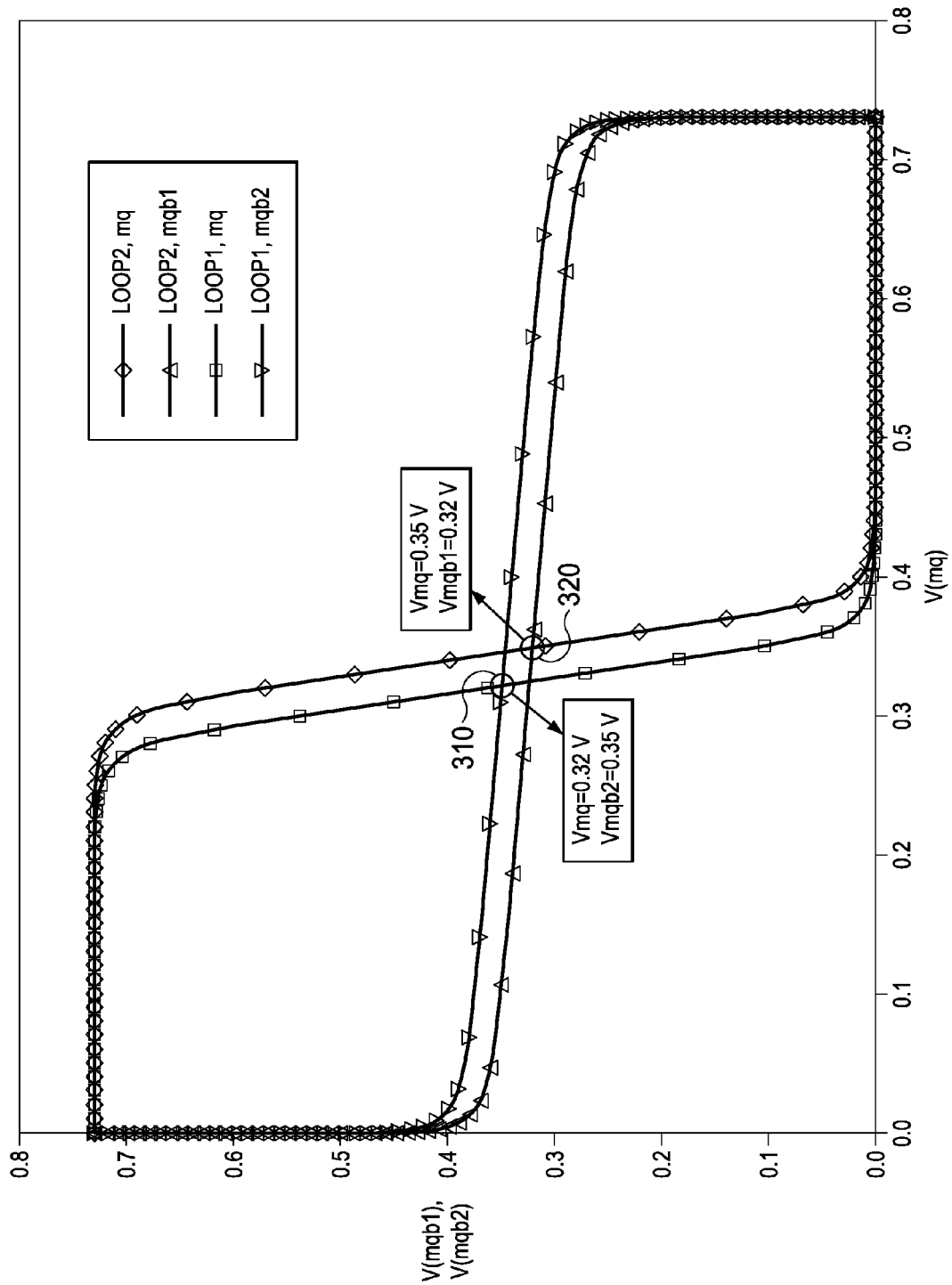
FIG. 3 is a graph illustrating metastable states for the two decoupled loops of FIG. 2.

FIG. 3 illustrates butterfly curves for points, mq, mqb1 and mqb2 during the operation of an example embodiment of the Loop1 210 and the Loop2 220, showing the first and second stable states at about 0 volts for the point mq and about 0.73 volts for the points mqb2 and mqb1. By selecting the properties of the MOSs in the inverters 211, 212, the metastable state 310 of the Loop1 210 lies at about Vmq=0.32 volts and Vmbq2=0.35 volts, hence skewed slightly toward the first stable state. Likewise, the properties of the MOSs in the inverters 221, 222 are selected such that the metastable state 320 of the Loop2 220 lies at about Vmq=0.35 volts and Vmbq1=0.32 volts, hence skewed slightly toward the second stable state.

Figure 5:
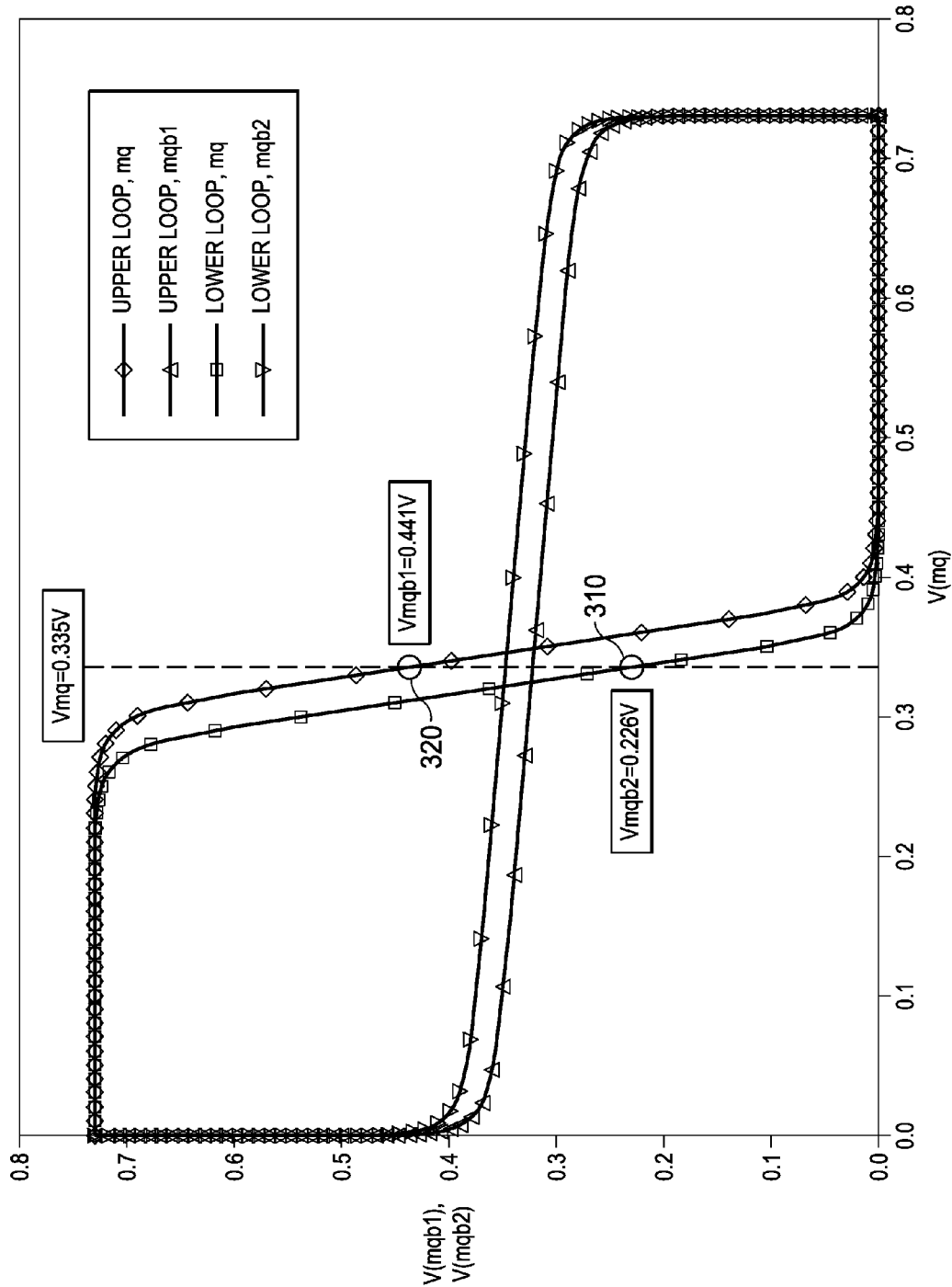
FIG. 5 is a graph illustrating metastable states for the two coupled loops of FIG. 4.

FIG. 4 is a schematic diagram of two cross-coupled inverter loops with a shared mq node. Comparing FIG. 4 to FIG. 2, it is apparent that the points mq of both the Loop1 210 and the Loop2 220 have been coupled in FIG. 4. Coupling the points mq has the effect of forcing mq to be of equal voltage in both loops, which, in turn, merges the metastable states of both the Loop1 210 and the Loop2 220 into a single metastable state that expresses itself in each of the Loop1 210 and the Loop2 220 differently. FIG. 5 illustrates how they change in one example embodiment. Vmq is now forced to a value lying between its former, decoupled values, namely Vmq=0.335 volts. Consequently, the metastable state is expressed in the Loop1 by causing Vmbq2 to become 0.226. The metastable state is expressed in the Loop2 by causing Vmqb1 to become 0.441 volts. It should be noted that, by coupling mq of both the Loop1 210 and the Loop2 220, the merged metastable state has caused mqb2 and mqb1 to be skewed even more toward the first and second stable states.

Figure 6:
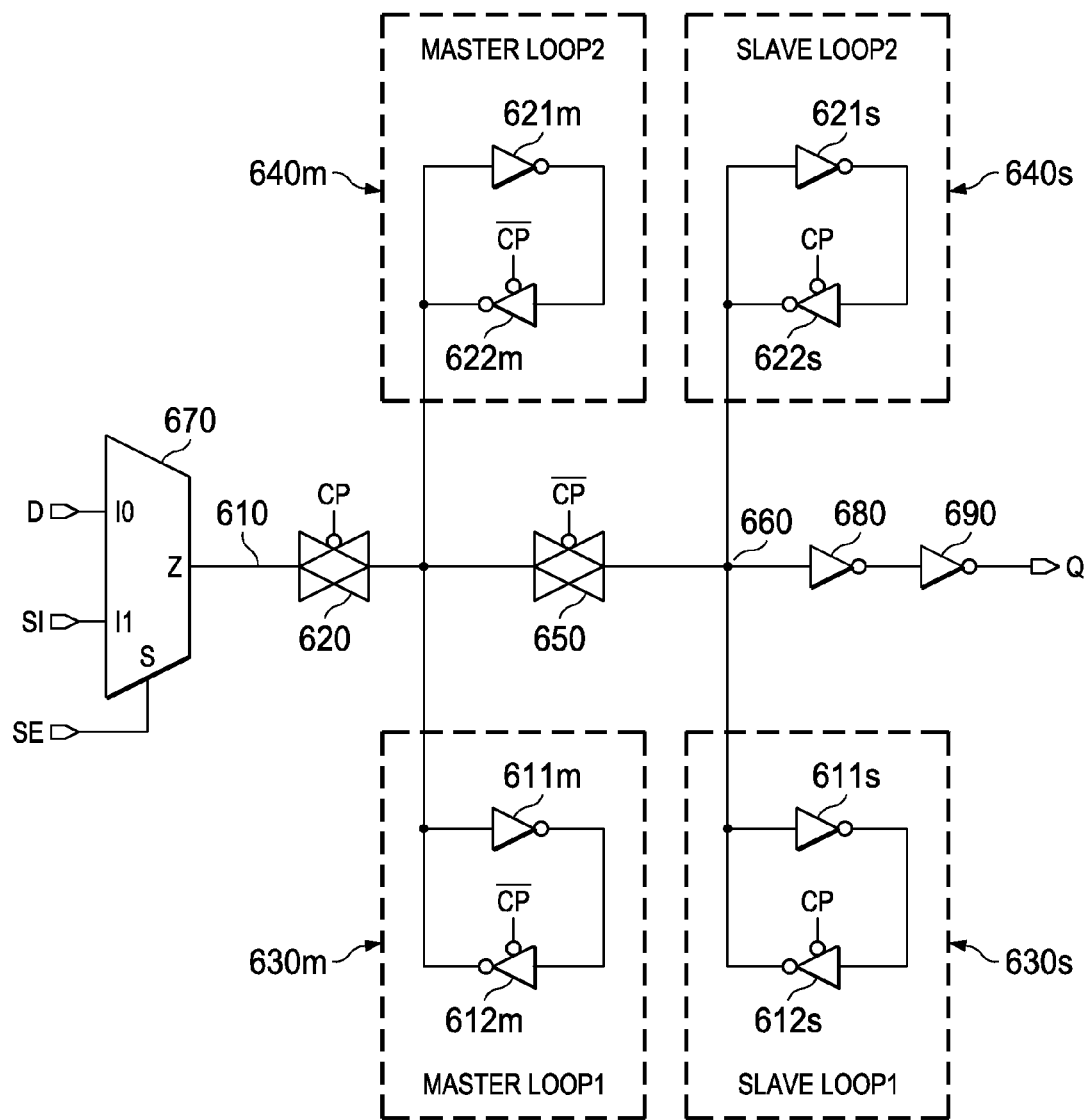
FIG. 6 is a schematic diagram of one embodiment of a flip-flop.

Having described some theory regarding metastable states and they may be skewed in uncoupled and coupled loops, various embodiments of a flip-flop employing multiple, coupled loops will now be described. FIG. 6 is a schematic diagram of one embodiment of a flip-flop. The flip-flop includes a flip-flop input 610.

A first transmission gate 620 is coupled to the flip-flop input and operable to be controlled by a noninverted clock signal CP. A master Loop1 630m is coupled to the first transmission gate 620 and includes cross-coupled inverters 611m, 612m. The inverter 612m is controlled by an inverted clock signal ~CP. The inverters 611m, 612m define first and second stable states (logic zero and logic one in one embodiment). A master Loop2 640m is coupled to the first transmission gate 620 and the master Loop1 630m and includes cross-coupled inverters 621m, 622m. The inverter 622m is controlled by the inverted clock signal ~CP. The inverters 621m, 622m define the first and second stable states. The properties of the cross-coupled inverters 611m, 612m, 621m, 622m in the master Loop1 630m and the master Loop2 640m are selected such that a metastable state is created that is skewed toward the first stable state in the master Loop1 630m and skewed toward the second stable state in the master Loop2 640m.

A second transmission gate 650 is coupled to the master Loop1 630m and the master Loop2 640m. The second transmission gate 650 is operable to be controlled by the inverted clock signal ~CP. A slave Loop1 630s is coupled to the second transmission gate 650 and includes cross-coupled inverters 611s, 612s. The inverter 612s is controlled by the noninverted clock signal CP. The inverters 611s, 612s define the first and second stable states. A slave Loop2 640s is coupled to the second transmission gate 650 and the slave Loop1 630s and includes cross-coupled inverters 621s, 622s. The inverter 622s is controlled by the noninverted clock signal CP. The inverters 621s, 622s define the first and second stable states. The properties of the cross-coupled inverters 611s, 612s, 621s, 622s in the slave Loop1 630s and the slave Loop2 640s are selected such that a metastable state is created that is skewed toward the first stable state in the slave Loop1 630s and skewed toward the second stable state in the slave Loop2 640s. In the illustrated embodiment, the first metastable state in the slave Loop1 630s approximates the first metastable state in the master Loop1 630m. Also in the illustrated embodiment, the first metastable state in the slave Loop2 640s approximates the first metastable state in the master Loop2 640m. Finally, the flip-flop has a flip-flop output 660 coupled to the slave Loop1 630s and the slave Loop2 640s.

The flip-flop embodiment of FIG. 6 is capable of accommodating a test mode in which scan data may be provided to the flip-flop in lieu of operational data. Accordingly, FIG. 6 further illustrates a scan multiplexer 670 having a data input D, a scan input SI, a scan enable input SE and an output Z coupled to the flip-flop input 610. The flip-flop embodiment further has drivers coupled to the flip-flop output 660 that take the form of first and second inverters 680, 690 coupled in series.

Figure 7:
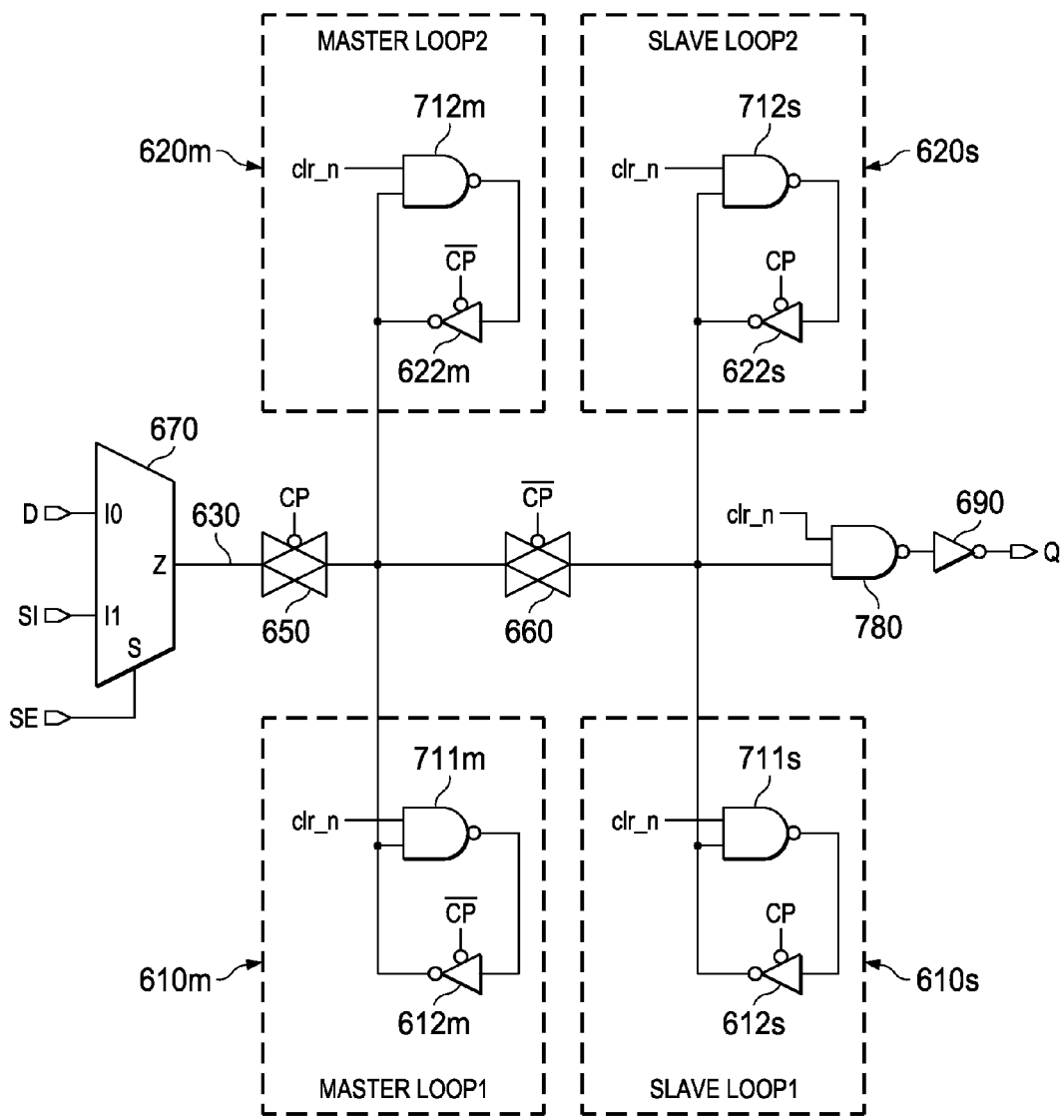
FIG. 7 is a schematic diagram of another embodiment of a flip-flop.

FIG. 7 is a schematic diagram of another embodiment of a flip-flop. The flip-flop embodiment of FIG. 7 is like that of FIG. 6, except that it is further provided with an asynchronous reset function by which the flip-flop can be reset upon asserting a clr_n signal. Accordingly, a second input is added to the inverters 611m, 612m, 611s, 612s of FIG. 6, yielding NAND gates 711m, 712m, 711s, 712s of FIG. 7. A second input is likewise added to the inverter 680 of FIG. 6, yielding a NAND gate 780. Each of the second inputs is operable to receive the clr_n signal as shown.

Figure 8:
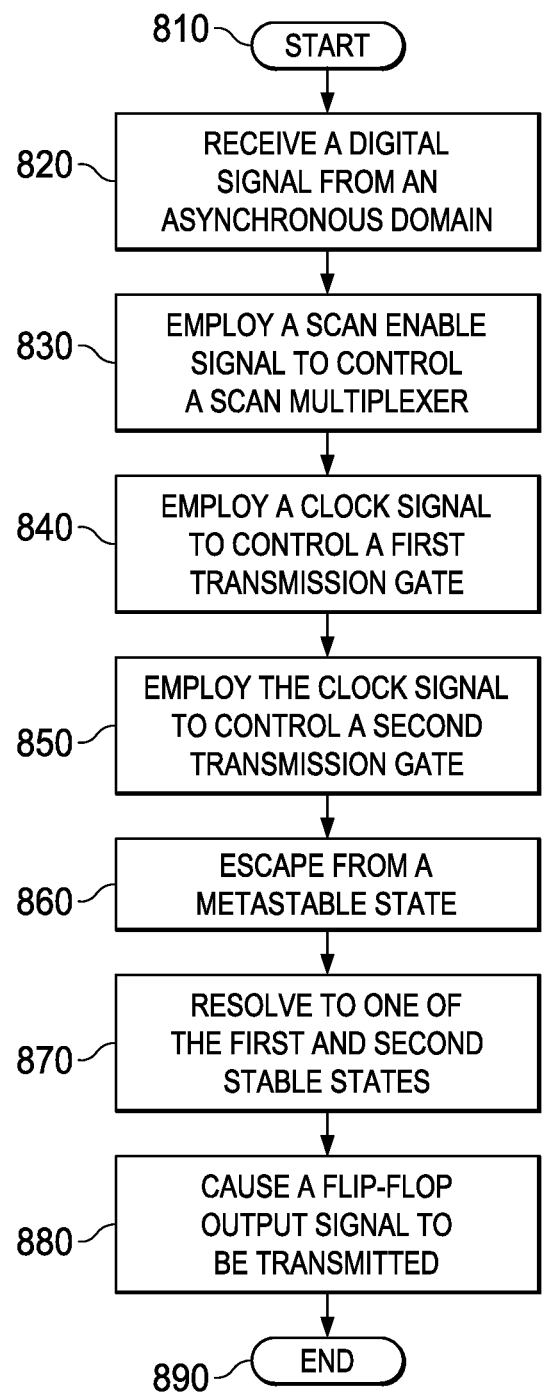
FIG. 8 is a flow diagram of one embodiment of a method of receiving a digital signal from an asynchronous domain.

FIG. 8 is a flow diagram of one embodiment of a method of receiving a digital signal from an asynchronous domain. The method begins in a start step 810. In a step 820, the digital signal is received from an asynchronous domain. In a step 830, a scan enable signal is employed to control a scan multiplexer which has a data input, a scan input, a scan enable input and an output coupled to the flip-flop input. In a step 840, a clock signal is employed to control a first transmission gate, which is coupled between first and second master loops and the flip-flop input, the first and second master loops having first and second stable states. In a step 850, the clock signal is also employed to control a second transmission gate, which is coupled between the first and second master loops and first and second slave loops, the first and second slave loops having the first and second stable states. Properties of cross-coupled inverters in the first and second master and first and second slave loops create a metastable state skewed toward the first stable state in the first master and slave loops and skewed toward the second stable state in the second master and slave loops. In a step 860, from the metastable state is escaped. In a step 870, the flip-flop resolves to one of the first and second stable states. In a step 880, a flip-flop output signal is caused to be transmitted through series-coupled first and second inverters. The method ends in an end step 890.

Table 1, below, sets forth and compares the performance of conventional, single-loop flip-flops with an embodiment of the flip-flop having multiple loops and a skewed metastable state as disclosed herein.

TABLE 1

| Flip-Flop Performance Comparison (MTBF = 100 years) | | | |
|---|---|---|---|
| | Single-Loop | Multiple-Loop | Improvement |
| Tau (ps) | 106.331 | 66.652 | 59.5% |
| Setup (ps) | 210.5 | 209.5 | 0.5% |
| Sync2d (MHz) | 201 | 295 | 46.7% |

To make a fair comparison, the single-loop flip-flop was designed with additional transistors, such that its IC area is similar to that of the multiple-loop flip-flop. It will be noted that tau, which is the clock-to-output delay of the flip-flop, and sync2d, which is the operating frequency of the flip-flop, are respectively improved by 59.5% and 46.7%, which is significant.

Those skilled in the art to which this application relates will appreciate that other and further additions, deletions, substitutions and modifications may be made to the described embodiments.

What is claimed is:

1. A flip-flop, comprising:
   a first loop coupled to a flip-flop input and having first and second stable states; and
   a second loop coupled to said first loop and having said first and second stable states, properties of cross-coupled inverters in said first and second loops creating a metastable state skewed toward said first stable state in said first loop and skewed toward said second stable state in said second loop.

2. The flip-flop as recited in claim 1 further comprising a transmission gate coupled between said first and second loops and said flip-flop input.

3. The flip-flop as recited in claim 1 wherein said first loop is a first master loop and said second loop is a second master loop, said flip-flop further comprising:
   a first slave loop coupled to said first and second master loops and having said first and second stable states; and
   a second slave loop coupled to said first slave loop and having said first and second stable states, properties of cross-coupled inverters in said first and second slave loops creating a metastable state skewed toward said first stable state in said first slave loop and skewed toward said second stable state in said second slave loop.

4. The flip-flop as recited in claim 3 further comprising a transmission gate coupled between said first and second slave loops and said first and second master loops.

5. The flip-flop as recited in claim 1 further comprising a scan multiplexer having a data input, a scan input, a scan enable input and an output coupled to said flip-flop input.

6. The flip-flop as recited in claim 1 further comprising first and second inverters coupled in series to an output of said flip-flop.

7. The flip-flop as recited in claim 1 wherein said flip-flop input is coupled to circuitry lying in an asynchronous domain.

8. A method of receiving a digital signal from an asynchronous domain, comprising:
   receiving said digital signal into a flip-flop having:
      a first loop coupled to a flip-flop input and having first and second stable states; and
      a second loop coupled to said first loop and having said first and second stable states, properties of cross-coupled inverters in said first and second loops creating a metastable state skewed toward said first stable state in said first loop and skewed toward said second stable state in said second loop;
   escaping from said metastable state; and
   resolving to one of said first and second stable states.

9. The method as recited in claim 8 further comprising employing a clock signal to control a transmission gate coupled between said first and second loops and said flip-flop input.

10. The method as recited in claim 8 wherein said first loop is a first master loop and said second loop is a second master loop, said flip-flop further having:
   a first slave loop coupled to said first and second master loops and having said first and second stable states; and
   a second slave loop coupled to said first slave loop and having said first and second stable states, properties of cross-coupled inverters in said first and second slave loops creating a metastable state skewed toward said first stable state in said first slave loop and skewed toward said second stable state in said second slave loop.

11. The method as recited in claim 10 further comprising employing a clock signal to control a transmission gate coupled between said first and second slave loops and said first and second master loops.

12. The method as recited in claim 8 further comprising employing a scan enable signal to control a scan multiplexer having a data input, a scan input, a scan enable input and an output coupled to said flip-flop input.

13. The method as recited in claim 8 further comprising causing a flip-flop output signal to be transmitted through series-coupled first and second inverters.

14. The method as recited in claim 8 wherein said receiving comprises receiving said digital signal from a separate clock domain.

15. A flip-flop, comprising:
   a flip-flop input;
   a first transmission gate coupled to said flip-flop input and operable to be controlled by a noninverted clock signal;
   a first master loop coupled to said flip-flop input and having first and second stable states;
   a second master loop coupled to said first master loop and having said first and second stable states, properties of cross-coupled inverters in said first and second master loops creating a metastable state skewed toward said first stable state in said first master loop and skewed toward said second stable state in said second master loop;
   a second transmission gate coupled to said first and second master loops and operable to be controlled by an inverted clock signal;
   a first slave loop coupled to said second transmission gate and having first and second stable states; and
   a second slave loop coupled to said first slave loop and having said first and second stable states, properties of cross-coupled inverters in said first and second slave loops creating a metastable state skewed toward said first stable state in said first slave loop and skewed toward said second stable state in said second slave loop.

16. The flip-flop as recited in claim 15 further comprising a scan multiplexer having a data input, a scan input, a scan enable input and an output coupled to said flip-flop input.

17. The flip-flop as recited in claim 15 further comprising first and second inverters coupled in series to an output of said flip-flop.

18. The flip-flop as recited in claim 15 wherein one of said cross-coupled inverters of each of said first and second master and slave loops is a NAND gate, said flip-flop further comprising a NAND gate and an inverter coupled in series to an output of said flip-flop.

19. The flip-flop as recited in claim 15 wherein said flip-flop input is coupled to circuitry lying in an asynchronous domain.

20. The flip-flop as recited in claim 15 wherein said flip-flop has a time constant of less than 100 picoseconds.

* * * * *